(12) United States Patent
Hom et al.

(10) Patent No.: US 7,374,648 B2
(45) Date of Patent: May 20, 2008

(54) SINGLE PIECE COIL SUPPORT ASSEMBLIES, COIL CONSTRUCTIONS AND METHODS OF ASSEMBLING COIL CONSTRUCTIONS

(75) Inventors: Len Hom, Dublin, CA (US); John D. Mize, Spokane Valley, WA (US); Robert M. Prater, Los Altos, CA (US); David K. Chan, San Francisco, CA (US); Gilbert Amador, Dublin, CA (US); Peter J. Kang, San Jose, CA (US)

(73) Assignee: Honeywell International Inc., Morristown, NJ (US)

( * ) Notice: Subject to any disclaimer, the term of this patent is extended or adjusted under 35 U.S.C. 154(b) by 628 days.

(21) Appl. No.: 10/880,172

(22) Filed: Jun. 28, 2004

(65) Prior Publication Data
US 2005/0284756 A1    Dec. 29, 2005

(51) Int. Cl.
*C23C 14/35* (2006.01)
*C23C 16/00* (2006.01)

(52) U.S. Cl. .............. 204/298.06; 204/298.11; 204/298.08; 204/192.1; 204/192.12; 118/723 I; 118/723 IR; 156/345.48

(58) Field of Classification Search ............ 204/298.11, 204/298.06, 298.08, 192.1, 192.12; 118/723 I, 118/723 IR; 156/345.48
See application file for complete search history.

(56) References Cited

U.S. PATENT DOCUMENTS 6,235,163 B1 *    5/2001   Angelo et al. ......... 204/192.12

FOREIGN PATENT DOCUMENTS

| EP | 1 067 584 A | 1/2001 |
| EP | 1 130 624 A | 9/2001 |
| WO | WO 2004/033742 A | 4/2004 |
| WO | WO 2004/079764 A | 9/2004 |
| WO | WO 2005/001918 A | 1/2005 |

* cited by examiner

*Primary Examiner*—Rodney G. McDonald

(57) ABSTRACT

The invention includes a coil support assembly having an insulator interfacing a surface of a shield disposed within a processing chamber. The insulator has an extension which extends through the shield. A second insulator is disposed between the shield and a coil and contacts a protrusion extending from the coil. A fastener is disposed through the first insulator and extends through the second insulator and into the protrusion. The fastener is electrically isolated from the shield by the first insulator. The invention includes coil assemblies containing the described coil support configuration. The invention further includes a method of supporting a coil within a processing chamber having a shield disposed therein. Insulators are inserted to extend from an outer side of the shield through a thickness of the shield. A coil is mounted within the chamber by inserting fasteners through each insulator into bosses which-protrude outwardly from the coil body.

18 Claims, 4 Drawing Sheets

SINGLE PIECE COIL SUPPORT ASSEMBLIES, COIL CONSTRUCTIONS AND METHODS OF ASSEMBLING COIL CONSTRUCTIONS

TECHNICAL FIELD

The invention pertains to coil constructions configured for utilization in a physical vapor deposition system, coil support assemblies and methods of supporting a coil within a processing chamber.

BACKGROUND OF THE INVENTION

Physical vapor deposition (PVD) is commonly utilized for formation of thin films or layers. For instance, PVD is commonly utilized for deposition of thin layers in semiconductor structures, with PVD being particularly useful for deposition of metallic materials. PVD processes are commonly referred to as sputtering processes and can comprise sputtering of desired materials from a target. The sputtered materials are deposited across a substrate to form a desired thin film.

An exemplary PVD operation is described with reference to an apparatus 10 shown in FIG. 1. Apparatus 10 is an example of an ionized metal plasma (IMP) apparatus and comprises a chamber 12 having sidewalls 14. Chamber 12 is typically a high vacuum chamber. A target 16 is provided in an upper region of the chamber and a substrate 18 is provided in a lower region of the chamber. Substrate 18 is retained on a holder 20 which can typically comprise an electrostatic chuck. Target 16 can be retained within the chamber with suitable supporting members (not shown) which can include a power source. A shield 22 can be provided to shield chamber walls from sputtered material. Shield 22 is typically made of a conductive material.

Target 16 can comprise, for example, one or more of aluminum, cadmium, cobalt, copper, gold, indium, molybdenum, nickel, niobium, palladium, platinum, rhenium, ruthenium, silver, tin, tantalum, titanium, tungsten, vanadium, stainless steel and zinc. These target materials can be in elemental, compound or alloy form. The target can be a monolithic target or can be part of a target/backing plate assembly.

Substrate 18 can comprise, for example, a semiconductor wafer such as a single crystal silicon wafer.

During physical vapor deposition, material is sputtered from a surface of target 16 and directed toward substrate 18. The sputtered material is represented by arrows 24. Generally, the sputtered material will leave the target surface in a number of different directions. This can be problematic and it is preferred that the sputtered material be directed relatively orthogonal to an upper surface of the substrate 18. Accordingly, a focusing coil 26 is provided within chamber 12. The focusing coil can improve the orientation of sputtered materials as depicted in FIG. 1 by arrows 24a. As shown, initially sputtered material can be redirected by passing through coil 26 to proceed relatively orthogonal to the upper surface of substrate 18.

Coil 26 is retained within chamber 12 by support members 30. Supports 30 can typically provide attachment of coil 26 to shield 22. Because shield 22 and coil 26 are each conductive, support structure 30 can typically provide electrical insulation between the shield and the coil.

Coil 26 can typically be formed from a conductive material which is generally the same as the target since material can be sputtered from the coil by plasma ions during deposition processing.

Exemplary prior art mounting assemblies and coil mounting configurations are discussed with respect to FIGS. 2 and 3. Referring initially to FIG. 2, coil 26 can be mounted within a processing chamber by providing a support assembly 30 which passes through shield 22. In the prior art coil mounting assembly shown in FIG. 2, coil body 27 has an opening 25 which passes through the thickness of the coil body. A pin 36 can be inserted through the coil body for mounting purposes. A spacer or cup 38 can be mounted externally on coil body 27 and can surround inner pin portion 36. Support assembly 30 can comprise a multi-piece configuration having a first insulative piece 31 that passes partially or completely through shield 22. First insulator 31 can contact cup portion 38. A second insulative piece 32 can be provided externally to shield 22 relative to first insulator portion 31.

When the depicted coil is mounted within a processing chamber, the coil can be spaced from shield 22 by cup portion 38 and first insulator 30 disposed between coil body 27 and an interior or first site 21 of shield 22. Second insulator 32 can typically be disposed entirely on an external side 23 of shield 22 and can interface the shield opposing first insulator 31.

Assembly 30 can further comprise a fastener 34 such as a bolt or screw as shown in FIG. 2. The fastener can extend through insulative support parts 32, 31 and can insert into centrally disposed pin portion 36 for mounting coil 26 within shield 22.

Coil 26 as shown in FIG. 2 is generally provided within the chamber as a kit comprising pins 36, retaining screws 34, cups 38, and insulative pieces 31 and 32 along with various other components (e.g. inner conductor components) which are not shown in FIG. 2. The coils utilized in such kits will comprise annular rings (referred to herein as annular bodies or annular coil bodies) having openings extending therethrough. Coil 26 will wear out with time and replacement kits are provided for replacement of the coil. Such kits will typically comprise a coil together with the numerous separate components for attaching the coil to the shield. The kit is assembled in order to provide the coil within the chamber and assembly typically comprises assembling the various components and inserting fastener 34 which is typically threadably engaged within an interior periphery of pin 36.

The coil structure shown in FIG. 2 is an exemplary pin and cup type prior art coil structure. Other pin and cup type structures and mounting configurations have been developed. For instance, monolithic coil structures have been constructed in which cups and inner conductors and/or the pin portion are one-piece with the coil. An advantage of forming monolithic coils structures is that such can eliminate utilization of pins and thereby eliminate discontinuities along an inner peripheral surface of a coil by eliminating the recessed pinhead otherwise present along the inner periphery of the coil. An advantageous of eliminating discontinuities from the inner periphery of the coil is that such can improve longevity of the coil and performance of the coil.

An exemplary prior art mounting assembly for utilization with a monolithic coil is depicted in FIG. 3. As shown, coil 26 has a protrusion or 'boss' 40 which is integral with coil body 27. Boss structure 40 can be configured to mimic a combination of pin and cup features such as those shown in FIG. 2. The boss configuration 40 shown in FIG. 3 is but an exemplary configuration and alternative boss shapes and structures have been developed. Mounting of a monolithic coil can typically utilize prior art support assemblies having a first insulative component 31 which extends through shield 22 as shown in FIG. 3. Insulator 31 can insulate a fastener 34 thereby electrically isolating the fastener from shield 22. The assembly can further comprise a second insulator disposed externally to shield 22 relative to internally disposed coil 26 and first insulator 31. Mounting of monolithic coil 26 can comprise insertion of fastener 34 through insulator portions 32 and 31 and threadably engaging fastener 34 into a threaded portion of boss 40.

Monolithic coil structures which have been produced have been utilized in modified physical vapor deposition apparatuses. In other words, the monolithic coil assemblies have not corresponded to assemblies which can be substituted for kit constructions utilized in conventional physical vapor deposition apparatuses, but instead have differences which make them suitable for apparatuses other than conventional apparatuses described above. Regardless of whether the coil kits comprise a monolithic coil and assembly as shown in FIG. 3 or the prior art pin and cup coil with the support assembly shown in FIG. 2, such prior art coil kits can be difficult to mount within a processing chamber. Pin and cup coil configurations and corresponding assemblies such as that shown in FIG. 2 can be difficult to mount due to the need to align and correctly assemble multiple pieces during the mounting process. Although the monolithic target shown in FIG. 3 reduces the number of pieces which must be simultaneously aligned during mounting, the limited space within the confines of shield 22 can make positioning and alignment of the coil within the shield extremely difficult. Typical prior art configurations of insulator parts 31 and 32 such as those depicted in FIGS. 2 and 3 can add to the difficulty in coil mounting.

It would be desirable to develop new configurations for coil support assemblies.

SUMMARY OF THE INVENTION

In one aspect the invention encompasses a coil construction configured for utilization in a physical vapor deposition chamber. The construction includes an annular coil body having an inner periphery and an opposing outer periphery. A plurality of electrically conductive bosses extends from the outer periphery of the coil body. A shield surrounds the annular coil and has a first side which faces the coil and an opposing second side separated from the first side by the thickness of the shield. A plurality of support assemblies are disposed proximate the shield and the annular coil. Each support is associated with one electrically conductive boss and each comprises a first insulator spanning the thickness of the shield and a second insulator disposed between the first insulator and the associated electrically conductive boss.

In one aspect the invention encompasses a coil support assembly. The assembly includes an insulative body having a surface configured to interface a first surface of a shield disposed within a processing chamber. The insulative body has an extension configured to extend through the shield. A second insulative body is configured to be disposed between the shield and an inductive coil. A portion of the second insulative body is configured to contact a coil protrusion extending from the inductive coil toward the shield. A fastener is disposed within the first insulative body and extends through the second insulative body and into the protrusion. The fastener is electrically isolated from the shield by the first insulative body.

In one aspect the invention encompasses a method of supporting an inductive coil within a processing chamber. The method includes providing a processing chamber with a shield disposed therein. A first insulator, a second insulator and a third insulator are inserted into the shield where the first, second and third insulators are spaced relative to each other along the shield and extend from an outer side of the shield through a thickness of the shield. A coil is introduced into the chamber such that the shield surrounds the coil. The coil comprises an annular body, a first boss, a second boss and a third boss, each of the bosses projecting outwardly from the annular body toward the shield. After the coil is introduced, the coil is mounted by inserting a first fastener through the first insulator into the first boss, inserting a second fastener through the second insulator into the second boss and inserting a third fastener through the third insulator and into the third boss. The insulators isolate the bosses and fasteners from the shield.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
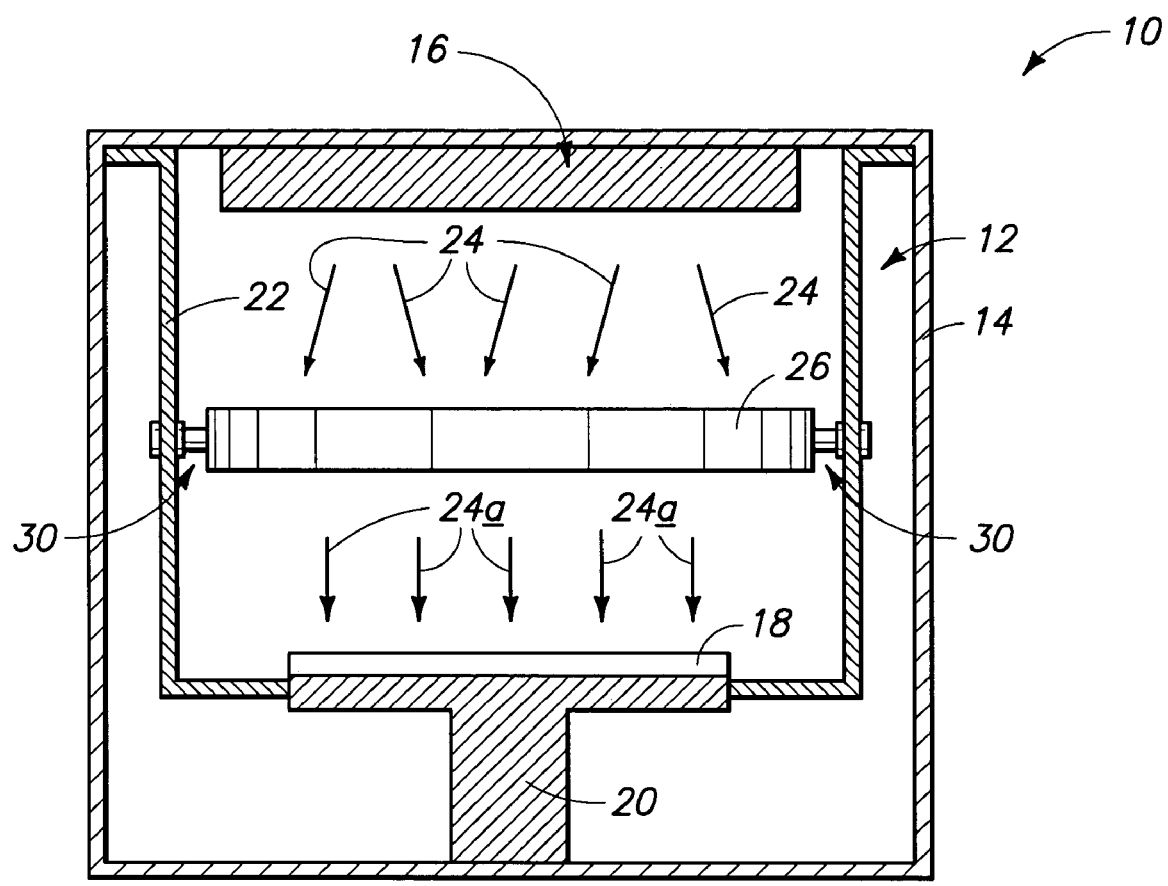
FIG. 1 is a diagrammatic cross-sectional view of a prior art physical vapor deposition apparatus shown during a physical vapor deposition (e.g., sputtering) process.
Figure 2:
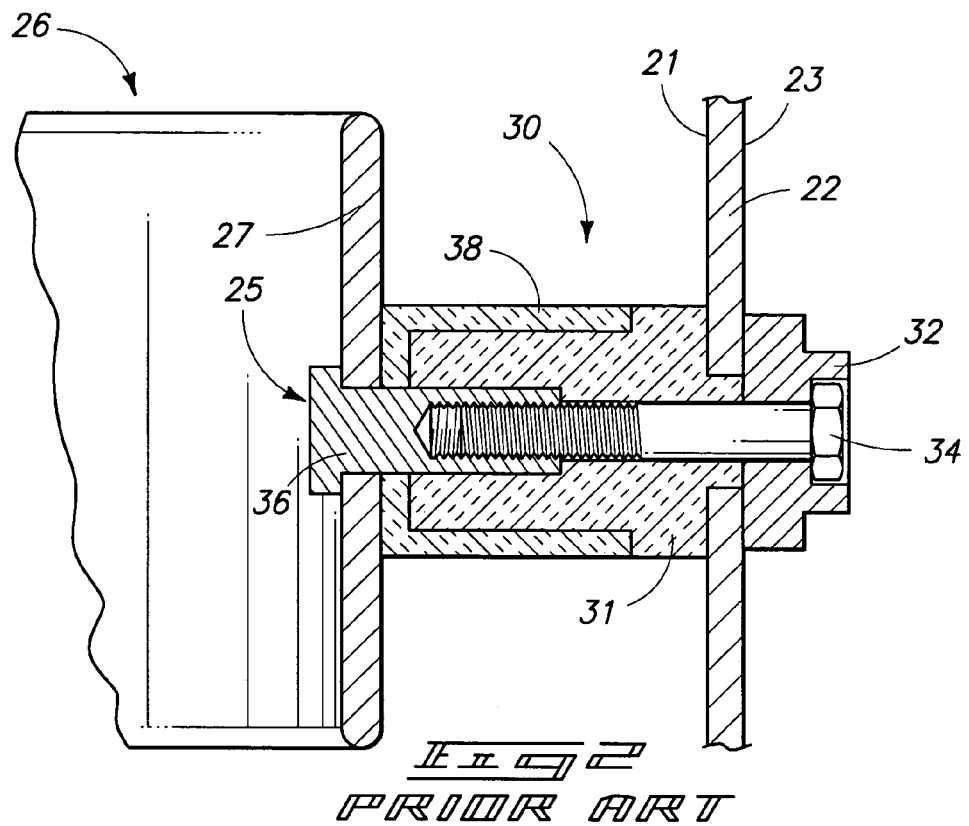
FIG. 2 is a diagrammatic cross-sectional fragmentary view. of a prior art assembly comprising a focusing coil retained to a sputtering chamber shield.
Figure 4:
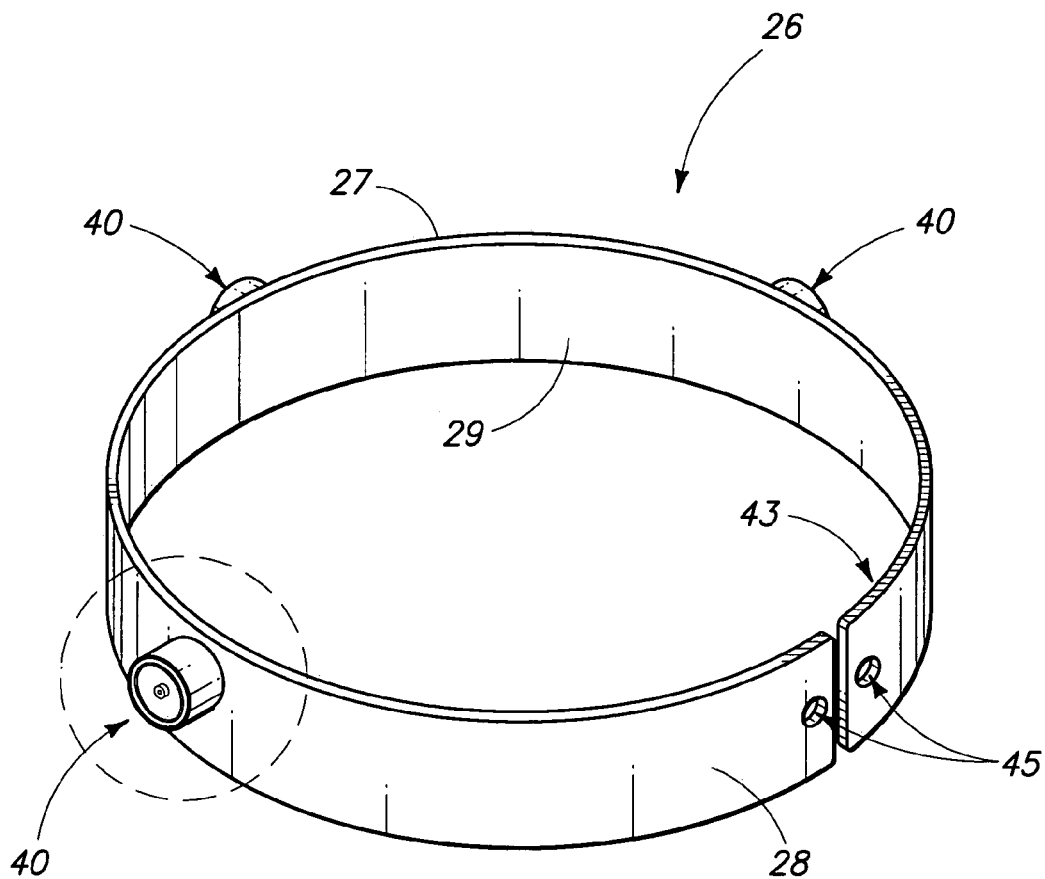
FIG. 4 is a view of an exemplary prior art focusing coil.
Figure 5:
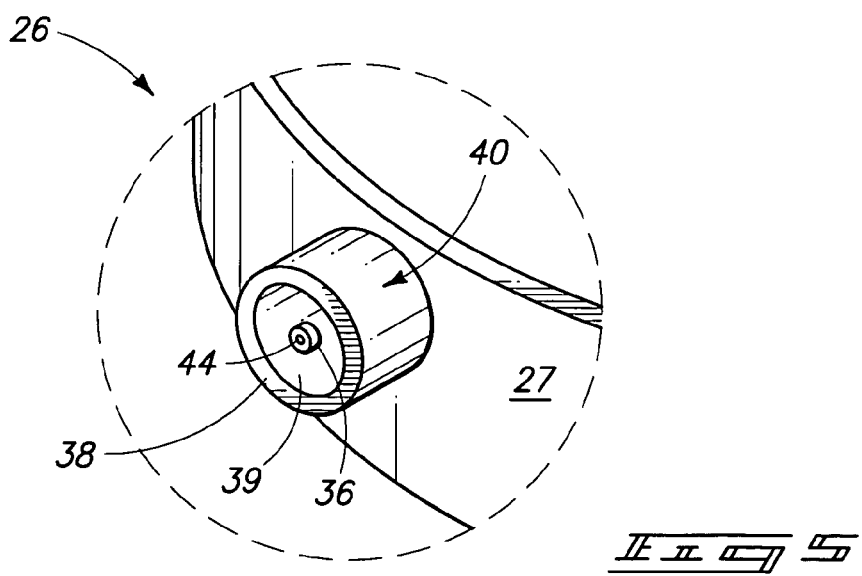
FIG. 5 is an enlarged view of a portion of the monolithic coil shown in FIG. 4.

The invention pertains to support assemblies for coil constructions that can be utilized in a physical vapor deposition chamber. As discussed in the background section of the disclosure, focusing coils utilized with physical vapor deposition chambers have a limited lifetime. The focusing coils are typically replaced utilizing a replacement kit with such kit including numerous components such as, for example, an annular coil, a plurality of cups, and a plurality of pins. Kits for replacement of monolithic coils can typical comprise a monolithic annular coil having integral projecting support hubs (also referred to as bosses) and a number of support assembly components for mounting the coil within the deposition chamber via attachment to the shield. An exemplary reaction chamber construction which utilizes a monolithic coil replacement kit is an ENDURA™ IMP 5500 sputtering system An exemplary monolithic coil 26 in accordance with the invention that can be utilized in this type of sputtering chamber is depicted in FIGS. 4 and 5. Monolithic coil 26 can typically comprise material similar to or identical to the sputtering target to be utilized in a particular application. Coil 26 has an annular coil body 27 having an outer periphery 28 and an opposing inner periphery 29. The coil depicted in FIG. 4 has a plurality of integral bosses 40 extending from outer periphery 28. Bosses 40 are single 1-piece constructions which replace cup and inner conductor components of alternative coil types (such as shown in FIG. 2). As shown in FIG. 4, the annular coil can have three circular bosses. However, the invention encompasses utilization of coils having alternative numbers, shapes and/or sizes of bosses.

Annular coil 26 additionally comprises a pair of openings 45 configured for receipt of a pair of electrode assemblies (not shown) which provide power to the coil. Openings 45 are separated from one another by a slot 43. The shape of the slot shown in FIG. 5 corresponds to a straight-gap configuration. Alternative slot configurations are available and the invention encompasses utilization of coils having alternative slot configurations. The invention additionally encompasses utilization of annular coils in which electrodes are integral with the annular body in place of openings 45 (not shown).

Figure 3:
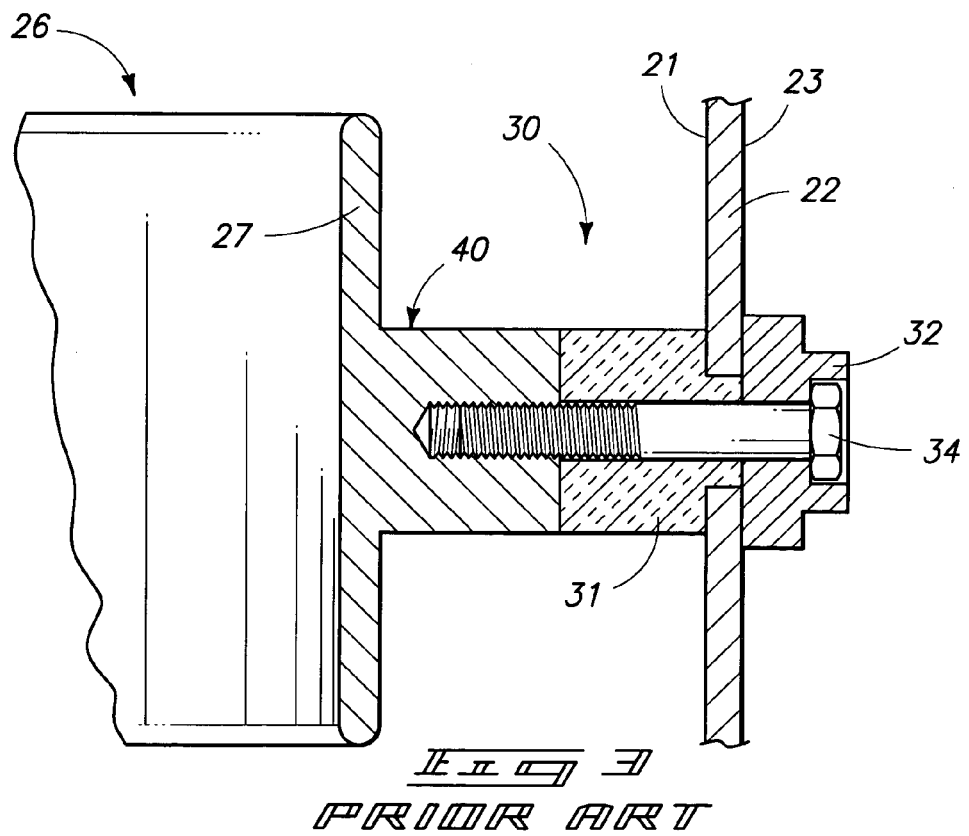
FIG. 3 is a diagrammatic cross-section fragmentary view of a prior art assembly comprising a monolithic focusing coil retained to a sputtering chamber shield.

Although the invention is described herein as pertaining to monolithic annular coil constructions, it is to be understood that the invention can be adapted for utilization with alternative coil configurations such as conventional pin and cup configurations (e.g., FIG. 3).

FIG. 5 is an enlarged view of a portion of the coil configuration shown in FIG. 4. The enlargement shown in FIG. 5 depicts an exemplary boss 40 which is a single piece having a "cup" portion 38 and a "pin" portion 36 separated by a gap or opening 39 which surrounds pin portion 36. The centrally disposed pin portion 36 can be receivably threaded to receive a threaded fastener. It is to be understood that the three-boss configuration shown in FIG. 5 is exemplary and the invention encompasses utilization of alternative boss numbers, shapes, sizes and configurations.

Boss 40 can be made to be integral with annular ring 27 by, for example, affixing the boss to the annular ring by methods such as welding. Alternatively, annular ring 27 and bosses 40 can be formed from a single piece of material using methods such as molding.

Replacement or mounting of a coil such as the exemplary coil of FIG. 4 within a processing chamber can be difficult using conventional mounting/support assemblies. For example, insulative support features such as the configurations shown in FIGS. 2 and 3 can hinder coil kit assembly due to the presence of extensions or "male" portions of insulative spacer component 31 which insert through shield 22 prior to introducing coil 26 within the shielded area. As discussed below, the assembly configurations of the invention can allow a coil to be introduced and positioned prior to providing an insulator piece through the shield.

Figure 6:
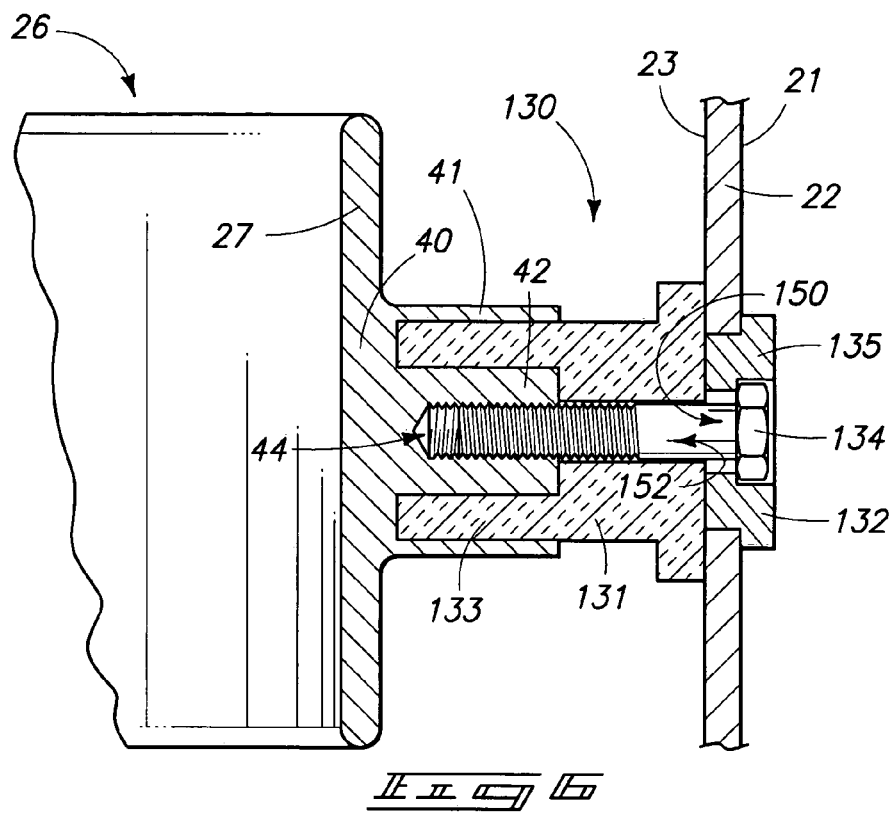
FIG. 6 is a diagrammatic cross-sectional fragmentary view of an exemplary monolithic coil construction and mounting assembly which can be formed in accordance with an aspect of the invention.
Figure 7:
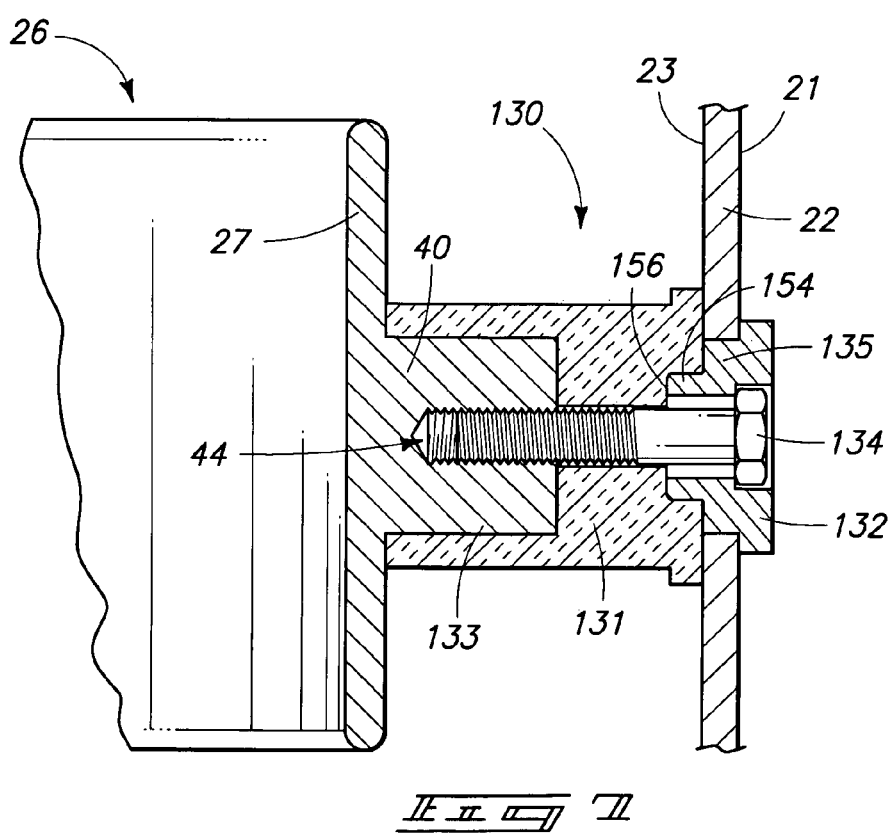
FIG. 7 is a diagrammatic cross-sectional fragmentary view of an alternative support assembly and monolithic coil construction in accordance with the invention.

FIGS. 6 and 7 diagrammatically illustrate exemplary coil support assemblies in accordance with the invention. The monolithic coil configuration of the invention includes modified ceramics (or alternative insulators) which can be fitted onto an annular coil allowing the combination of coil and ceramics to be introduced and position within the chamber as a single unit. In contrast, conventional coil kits configurations do not allow fitting the combination of the ceramics and coil into the chamber for positioning as a single piece.

Referring initially to FIG. 6, such shows a cross-section of a coil construction and a support assembly 130 in accordance with the invention. A coil 26 having an annular coil body 27 is attached to shield 22 utilizing a mounting assembly 130 having a first insulative support or spacer 131 disposed between coil body 27 and shield 22, and a second insulative component 132 disposed traversing shield 22.

As shown in FIG. 6, first insulative component 131 (also referred to as a support) can contact a boss 40 which extends from annular body 27. In contrast with prior art configurations, insulator 131 does not comprise an extension which inserts into shield 22. Insulator 131 can interface an inner surface 23 of shield 22 and can provide physical and electrical isolation of coil 26 from shield 22. The configuration of the shield interfacing portion of insulator 131 can allow coil 26 in combination with insulator 131 to be inserted within the area surrounded by shield 22 without hindrance of projections or extensions which protrude outwardly from the body of insulator 131.

As shown in FIG. 6, insulative component 131 can comprise an insertable extension piece 133 which can insert into a recess, well or opening within boss 40. Where boss 40 is configured to have a cup portion 41 and a pin portion 42 fabricated as a single part such as that shown, insulator 131 can be insertable into the boss within the cup portion and can surround pin portion 42.

Support assembly 130 can additionally comprise a second insulative component 132 which can interface an external surface 21 of shield 22. Insulator 132 can comprise an extension portion 135 which is insertable into shield 22 and can preferably span the thickness of the shield. In particular instances, insulator 132 can be configured to traverse the thickness of shield 22 without extending beyond the interior surface 23 of the shield, as shown in FIG. 6.

Support assembly 130 can additionally comprise a fastener 134. Exemplary fastener types which can be utilized include, but are not limited to, screws and bolts. Mounting assembly 130 can be configured such that fastener 134 is insertable through an opening 150 within insulative component 132 and. through an opening 152 within insulative component 131. Where the configuration of boss 40 is such that a pin portion 42 is present, the pin portion can have a threaded opening 44 receivably threaded for receipt of a portion of fastener 134 by threading a portion of the fastener into the threaded opening.

In the assembled coil assembly structure shown in FIG. 6, insulative component 132 electrically isolates fastener 134 from shield 22. Accordingly, the combination of insulator 132 and insulator 131 provide electrical insulation and isolation of shield 22 from coil 27 in the final assembled structure.

Insulative components 131 and 132 can be formed of identical materials or can be formed of differing materials. Insulative materials which can be utilized for insulative components 131 and 132 include, for example, ceramic materials.

The support assembly of the invention shown in FIG. 6 can allow easier coil mounting and coil kit assembly relative to prior art configurations. Coil assembly in accordance with the invention can comprise combining or assembling those portions of the coil assembly that will lie solely within the shielded area and introducing the combination into the processing chamber as a single unit. For example, coil 26 and insulator 131 can be joined or combined and the combination can be positioned within the shield. Insulator 132 can subsequently be inserted through shield 22 and fastener 132 can be introduced through insulator 132 through insulator 131 and can be threaded into boss 40. Alternatively, in the configuration shown in FIG. 6, insulator 132 can be positioned within shield 22 and the assembled combination of coil 26 and insulator 131 can be introduced as a unit by, for example, sliding the unit into position without hindrance of protruding insulator extensions along the plane of shield surface 23.

FIG. 7 shows an alternative assembly configuration in accordance with the invention. As shown in FIG. 7, insulative component 130 can comprise a further extension 154 which can be inserted into a recess 156 of insulator 131. Mounting of the coil utilizing the support assembly shown in FIG. 7 can comprise assembling coil 26 and insulator 131 and positioning the coil and insulator as a unit within the confines of shield 22, followed by insertion of insulator 132 through shield 22 and into the recess in insulator 131. This assembly method can allow stable positioning of the coil within the shielded area and thereby allow easier alignment and insertion of fastener 134 within the assembly components.

As shown in FIG. 7, internal insulator piece 131 can be configured to have an extension portion 137 which fits over and surrounds boss 40. This configuration can be especially useful where boss 40 is a solid protrusion having a single threaded opening 44 therein.

The assembly configurations of FIGS. 6 and 7 can be modified to adapt to alternative coil and/or boss configurations. The invention can also be modified to allow use with cup and pin type coils such as that depicted in FIG. 2. Further, various features of the assemblies shown in FIGS. 6 and 7 can be combined. For example, insulator 131 can comprise features to allow internal insertion into a boss such as shown in FIG. 6, as well as an extension such as extension 137 shown in FIG. 7 which surrounds the boss. The invention additionally encompasses configurations where insulator 131 lacks extensions (133 of FIG. 6 and 137 of FIG. 7) such that the insulator contacts only an outermost surface of boss 40 relative to coil body 27.

It is to be understood that the thicknesses of the various insulator portions shown in FIG. 6 relative to other portions relative to the shield and relative the coil and boss are exemplary only. The invention encompasses adaptation of thicknesses of each spacer and each portion of each spacer to accommodate any shield thickness, boss configuration and any additional assembly components (not shown).

The support assemblies of the invention can be particularly useful for monolithic tantalum coils. The assemblies can also be utilized with alternative coils such as those comprising one or more of aluminum, cadmium, cobalt, copper, gold, indium, molybdenum, nickel, niobium, palladium, platinum, rhenium, ruthenium, silver, tin, tantalum, titanium, tungsten, vanadium, stainless steel and zinc.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A coil construction configured for utilization in a physical vapor deposition system, comprising:
   an annular coil body having an inner periphery and an opposing outer periphery;
   a plurality of electrically conductive bosses extending from the outer periphery of the annular coil body;
   a shield surrounding the annular coil, the shield having a first side facing the annular coil and an opposing second side, the first and second sides being separated by a shield thickness; and
   a plurality of support assemblies, each support assembly being disposed proximate the shield and the annular coil and being associated with one electrically conductive boss, each support assembly comprising:
   a first insulator spanning the shield thickness; and
   a second insulator contacting the first insulator and contacting the associated electrically conductive boss, the second insulator extending from the first side of the shield to the electrically conductive boss.

2. The coil construction of claim 1 wherein the plurality of electrically conductive bosses is three electrically conductive bosses.

3. The coil construction of claim 1 wherein each of the plurality of electrically conductive bosses is an integral part of the annular coil.

4. The coil construction of claim 1 wherein each of the conductive bosses comprises a pin portion and a cup portion, and wherein the pin portion comprises an opening configured to receive a threaded fastener.

5. The coil construction of claim 4 wherein each of the bosses is welded to the annular coil body.

6. The coil construction of claim 4 wherein each of the bosses and the annular coil body are comprised by a single piece of material.

7. The coil construction of claim 4 wherein a portion of the second insulator inserts into the cup portion of the associated boss.

8. The coil construction of claim 4 wherein a portion of the second insulator surrounds the cup portion of the associated boss.

9. The coil construction of claim 1 wherein each support assembly further comprises a fastener extending through the first insulator, through the second insulator, and at least partially through the associated electrically conductive boss.

10. The coil construction of claim 1 wherein a portion of the second insulator inserts into a recess in the associated electrically conductive boss.

11. The coil construction of claim 1 wherein the coil comprises tantalum.

12. The coil construction of claim 1 wherein the first and second insulators each comprise a ceramic material.

13. A coil support assembly comprising:
   an insulative body having a surface configured to interface a first surface of a shield disposed within a processing chamber, the insulative body having an extension configured to extend through the shield;
   a second insulative body configured to be disposed between the shield and an inductive coil, a portion of the second insulative body being configured to contact a protrusion extending from the inductive coil toward the shield, the second insulative body extending from the protrusion to the shield; and
   a fastener disposed through the first insulative body, the fastener extending through the second insulative body and into the protrusion, the first insulative body electrically isolating the fastener relative to the shield.

14. The coil support assembly of claim 13 wherein the shield has a thickness and has a second surface opposing the first surface and separated therefrom by the thickness, and wherein the extension of the first insulative body spans the thickness of the shield and does not extend beyond the second surface.

15. The coil support assembly of claim 13 wherein the shield has a thickness and has a second surface opposing the first surface and separated therefrom by the thickness, and wherein the second insulative body interfaces the second surface of the shield.

16. The coil support assembly of claim 13 wherein the protrusion comprises an opening and wherein a portion of the second insulative body is configured to insert into the opening.

17. The coil support assembly of claim 13 wherein the second insulative body comprises an opening configured for insertion of at least a portion of the protrusion.

18. The coil support assembly of claim 13 wherein each of the first and the second insulative bodies comprises a ceramic material.

* * * * *